(12) United States Patent
Kanamaru et al.

(10) Patent No.: US 7,622,674 B2
(45) Date of Patent: Nov. 24, 2009

(54) WIRE HARNESS LEADING-OUT PORT STRUCTURE OF ELECTRIC CONNECTION BOX

(75) Inventors: Masahiro Kanamaru, Shizuoka-ken (JP); Makoto Nakayama, Shizuoka-ken (JP); Tarou Inoue, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 12/105,771

(22) Filed: Apr. 18, 2008

(65) Prior Publication Data

US 2008/0257600 A1    Oct. 23, 2008

(30) Foreign Application Priority Data

Apr. 19, 2007    (JP) .......................... P2007-110396

(51) Int. Cl.
*H02G 3/08* (2006.01)
(52) U.S. Cl. .............................. 174/50; 174/58; 174/59; 174/61; 439/76.2; 361/600
(58) Field of Classification Search ................... 174/50, 174/58, 59, 61, 54, 68.1, 72 A; 439/465, 439/942, 76.2, 535, 521; 248/906; 361/600; 220/3.8, 3.2, 4.02
See application file for complete search history.

(56) References Cited

U.S. PATENT DOCUMENTS

| | | | | |
|---|---|---|---|---|
| 6,069,315 | A * | 5/2000 | Tang ............................ | 174/50 |
| 6,641,429 | B1 * | 11/2003 | Wu ............................. | 439/465 |
| 7,173,184 | B2 * | 2/2007 | Hull et al. ...................... | 174/58 |
| 7,358,438 | B2 * | 4/2008 | Zoller ......................... | 174/50 |
| 7,414,193 | B1 * | 8/2008 | Le, Phong ................... | 174/66 |
| 7,445,490 | B2 * | 11/2008 | Jacobson ..................... | 439/465 |
| 7,507,905 | B2 * | 3/2009 | Kanamaru et al. ............ | 174/50 |

FOREIGN PATENT DOCUMENTS

JP    8-140235    5/1996

* cited by examiner

*Primary Examiner*—Dhiru R Patel
(74) *Attorney, Agent, or Firm*—Finnegan, Henderson, Farabow, Garrett & Dunner, L.L.P.

(57) ABSTRACT

A wire harness leading-out opening is provided at a junction between an electric connection box and a bottom surface cover which constitute an electric connection box. A cylindrical wire harness leading-out guide is provided on the periphery of the wire harness leading-out opening, and is formed in a way that the both circumferential ends of a half-cylindrical body formed on the electric connection box and a half-cylindrical body formed on the bottom surface cover are coupled to each other. In the inner circumference of a circumferential junction between the peripheral walls of the two half-cylindrical bodies, a concave portion is provided to accommodate a loose portion of an armoring member wrapped around the outer circumference of the wire harness.

5 Claims, 8 Drawing Sheets

WIRE HARNESS LEADING-OUT PORT STRUCTURE OF ELECTRIC CONNECTION BOX

BACKGROUND OF THE INVENTION

1. Field of the Invention

The present invention relates to a wire harness leading-out port structure of an electric connection box which is mounted in an automobile.

2. Description of the Related Art

The protector structure disclosed in Japanese Unexamined Patent Publication No. 08-140235 is known as a structure of a wire-harness leading-out port of an electric connection box which is mounted in an automobile. FIGS. 1A and 1B illustrate a structure similar to the above-mentioned wire harness leading-out port structure of an electric connection box.

In the electric connection box, as shown in FIG. 1A, a wire harness leading-out opening 102 is provided at a junction between a body 103 and a cover 104, which constitute the electric connection box, and is used for leading out a wire harness W from the inside of the electric connection box to the outside thereof. A cylindrical wire harness leading-out guide 120 is provided on the periphery of the wire harness leading-out opening 102, and is configured in a way that a half-cylindrical body 121 formed on the body 103 and a half-cylindrical body 122 formed on the cover 104 are coupled to each other.

In some cases, after an armoring member S, such as a resin sheet (for example, a plastic protection sheet) and a piece of tape, is wrapped around the outer circumference of the wire harness, the half-cylindrical body 121 formed on the body 103 and the half-cylindrical body 122 formed on the cover 104 are coupled to each other around the wire harness so as to prevent water from coming in from the wire harness leading-out port and/or to fix the wire harness W well. In such cases, in the structure of the related wire harness leading-out port described above, any looseness (wrinkles and the like) of the armoring member S covering the wire harness W could cause the following problems, for example. Since such looseness is likely to be caught at the junctions between the half-cylindrical bodies 121 and 122, it would be difficult to attach the cover 104 to the body 103. If a gap d as shown in FIG. 1B is created at the junction due to such looseness, water might come in from the wire harness leading-out port, the wire harness W might not be fixed well, and the assembly of the cover 104 to the body 103 might be unstable.

SUMMARY OF THE INVENTION

Having been conducted in view of solving the above-described problems in the related art, it is an object of the present invention to provide a wire harness leading-out port structure of an electric connection box. The wire harness leading-out port structure is provided with a portion for proactively accommodating a loose portion of an armoring member of the wire harness so that the electric connection box can be assembled more easily, that water can be further prevented from coming in from the wire harness leading-out port, and that the wire harness can be fixed more stably.

An aspect of the present invention is a wire harness leading-out port structure of an electric connection box, comprising: a first member and a second member to be coupled to each other, the coupled first member and second member having a wire harness leading-out opening formed at a junction between the first member and the second member, the wire harness leading-out opening being used for leading out a wire harness from an inside to an outside of the coupled first member and second member, the first member including a first half-cylindrical body around a periphery of the wire harness leading-out opening of the first member, the second member including a second half-cylindrical body around a periphery of the wire harness leading-out opening of the second member, wherein the first half-cylindrical body and the second half-cylindrical body are coupled to each other at both circumferential ends of the first and second half-cylindrical bodies so as to form a cylindrical wire harness leading-out guide for guiding the wire harness, and a concave portion for accommodating a loose portion of an armoring member wrapped around an outer circumference of the wire harness is formed in an inner circumference of a circumferential junction between peripheral walls of the first and second cylindrical bodies.

According to the aspect of the present invention, looseness of an armoring member (for example, a protection sheet and a piece of tape) wrapped around a wire harness can be accommodated into a concave portions formed in the inner circumference of a cylindrical wire harness leading-out guide. Accordingly, when two half-cylindrical bodies are coupled to each other to provide the cylindrical wire harness leading-out guide, there is no risk of catching a loose portion of the armoring member at the junction between the half-cylindrical bodies. In such a structure, a first member and a second member can be stably coupled to each other, and the assemble operation can be easily carried out. Furthermore, the two half-cylindrical bodies can be coupled to each other without creating any unnecessary gap therebetween, and there would be no risk of damaging the armoring member. As a result, with the first member and the second member stably coupled to each other, it is possible to further prevent water from coming in from the wire harness leading-out port of an electric connection box, and, at the same time, to improve the fixation of the wire harness.

The concave portion may be formed in a groove shape in a longitudinal direction of the wire harness, and may be formed so as to have a width of the groove gradually narrowing as approaching from the outside to the inside of the coupled first member and second member.

In the above-described configuration, the concave portions for accommodating a loose portion of the armoring member of the wire harness are formed in a groove shape along a longitudinal direction of the wire harness, and the groove-shaped concave portions are each formed so as to have the groove width gradually narrowing as approaching from the outside of the electric connection box to the inside thereof. Therefore, looseness of the armoring member can be tightened more strongly towards the inside of the electric connection box; thus, the waterproofing property and the fixation of the wire harness can be further improved.

Curved walls each having an L-shaped cross section bending outwardly for forming the concave portion may be respectively provided on both circumferential ends of a peripheral wall of any one of the first and second half-cylindrical bodies.

In the above-described configuration, a curved wall that has an L-shaped cross section is formed at both circumferential ends of one of the half-cylindrical bodies so as to form the concave portion for accommodating a loose portion of the armoring member of the wire harness. Accordingly, the concave portion can be formed without unnecessarily increasing the thickness of the half-cylindrical body; thus, it is possible to avoid deteriorating the formability in the resin molding process of the electric connection box.

The first member may be an electric connection box body, the second member may be a cover to be coupled subsequently to the electric connection box body in a sliding motion, and the concave portion may be formed on both circumferential ends of a peripheral wall of the second half-cylindrical body formed on the cover.

In the above-described configuration, the concave portion is provided at both ends of the half-cylindrical body formed on the cover, and therefore the concave portion can pick up and accommodate a loose portion of the armoring member of the wire harness as the cover is being coupled to the electric connection box body. Accordingly, the cover can be smoothly coupled to the electric connection box body without catching the loose portion of the armoring member. Then, the wire harness can be led out from the cylindrical wire harness leading-out guide composed of the two half-cylindrical bodies.

An axial direction of the wire harness leading-out guide may be arranged obliquely with respect to the direction in which the cover is slid into the electric connection body when the cover is coupled to the electric connection body.

According to the above-described configuration, along with the sliding movement to couple the cover to the electric connection box body, the half-cylindrical body formed on the cover can be coupled to the half-cylindrical body formed on the electric connection box body from an angle in a slightly sliding manner. Hence, a loose portion of the armoring member of the wire harness is less likely to be caught at the junctions between the two half-cylindrical bodies, and therefore the efficiency of the assembly operation can be improved.

BRIEF DESCRIPTION OF THE DRAWINGS

FIG. 1A is an overall lateral view, while FIG. 1B is a front view of the wire harness leading-out opening.

DESCRIPTION OF THE PREFERRED EMBODIMENT

Figure 1A:
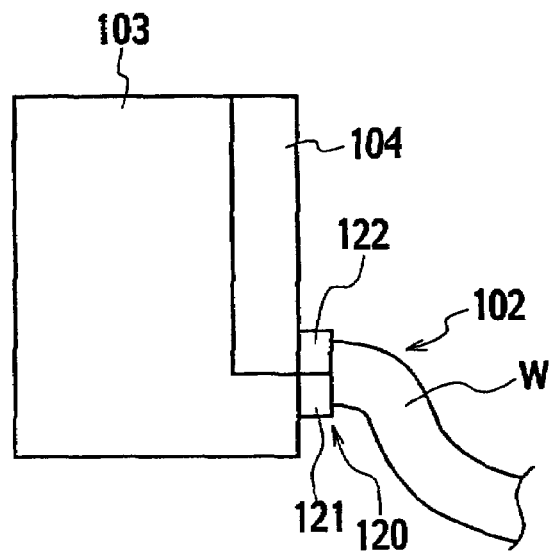
FIGS. 1A and 1B are drawings illustrating the structure of a prior art wire harness leading-out port of an electric connection box.
Figure 1B:
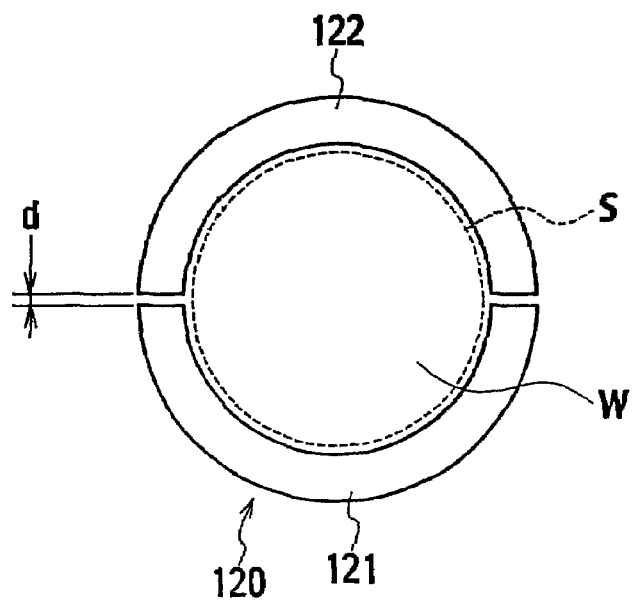

Hereinafter, an embodiment of the present invention will be described by referring to drawings. In the following drawings, the same or similar parts are denoted by the same or similar reference numerals.

Figure 2:
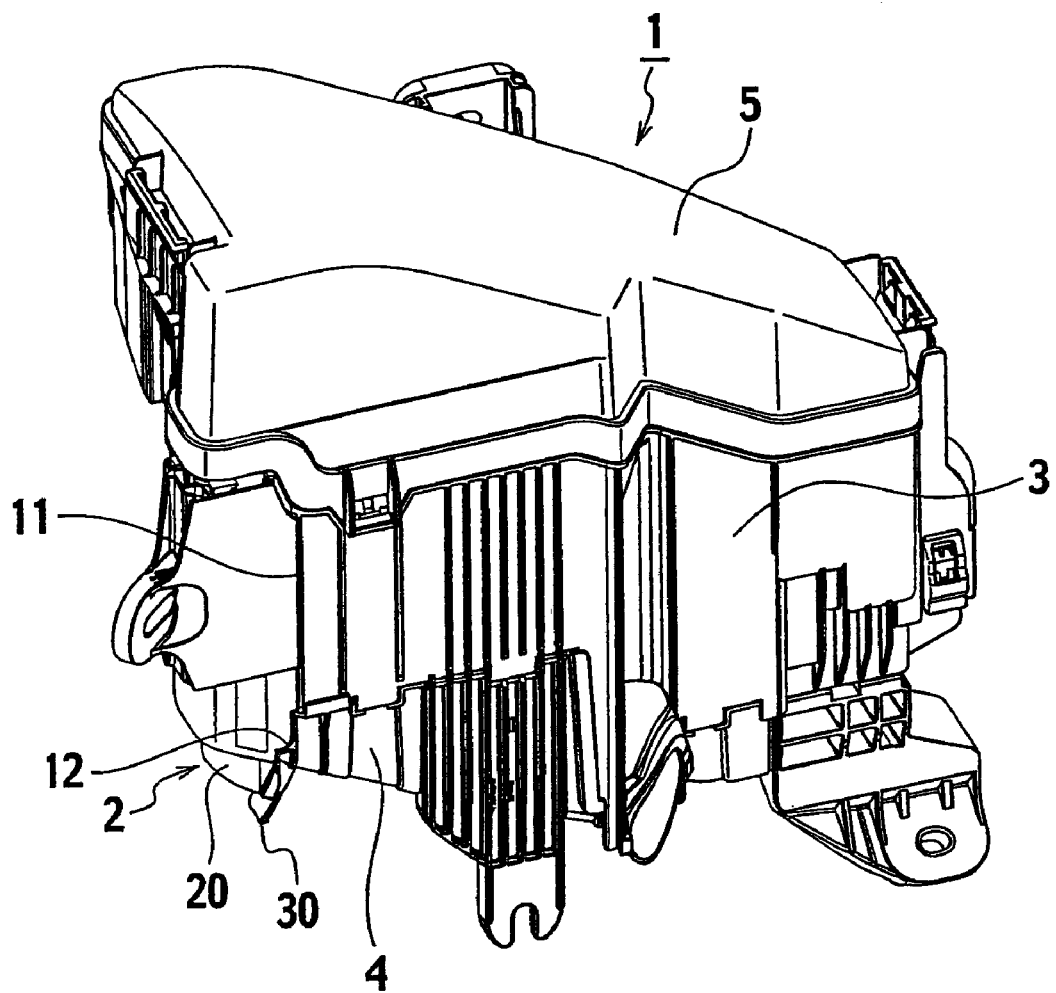
FIG. 2 is an external perspective view from obliquely above of an electric connection box according to an embodiment of the present invention.
Figure 3:
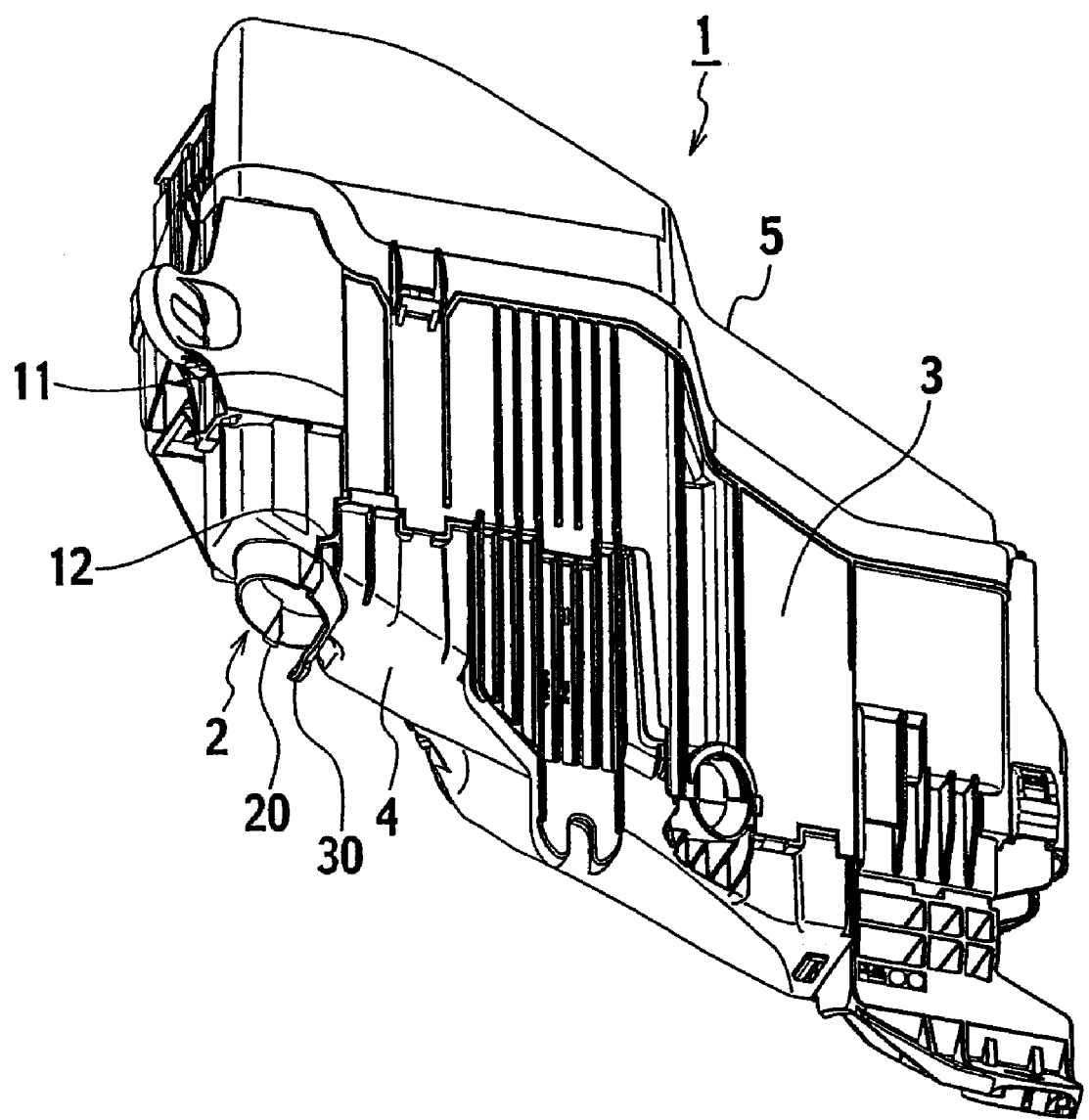
FIG. 3 is an external perspective view from obliquely below of the electric connection box according to the embodiment of the present invention.
Figure 4:
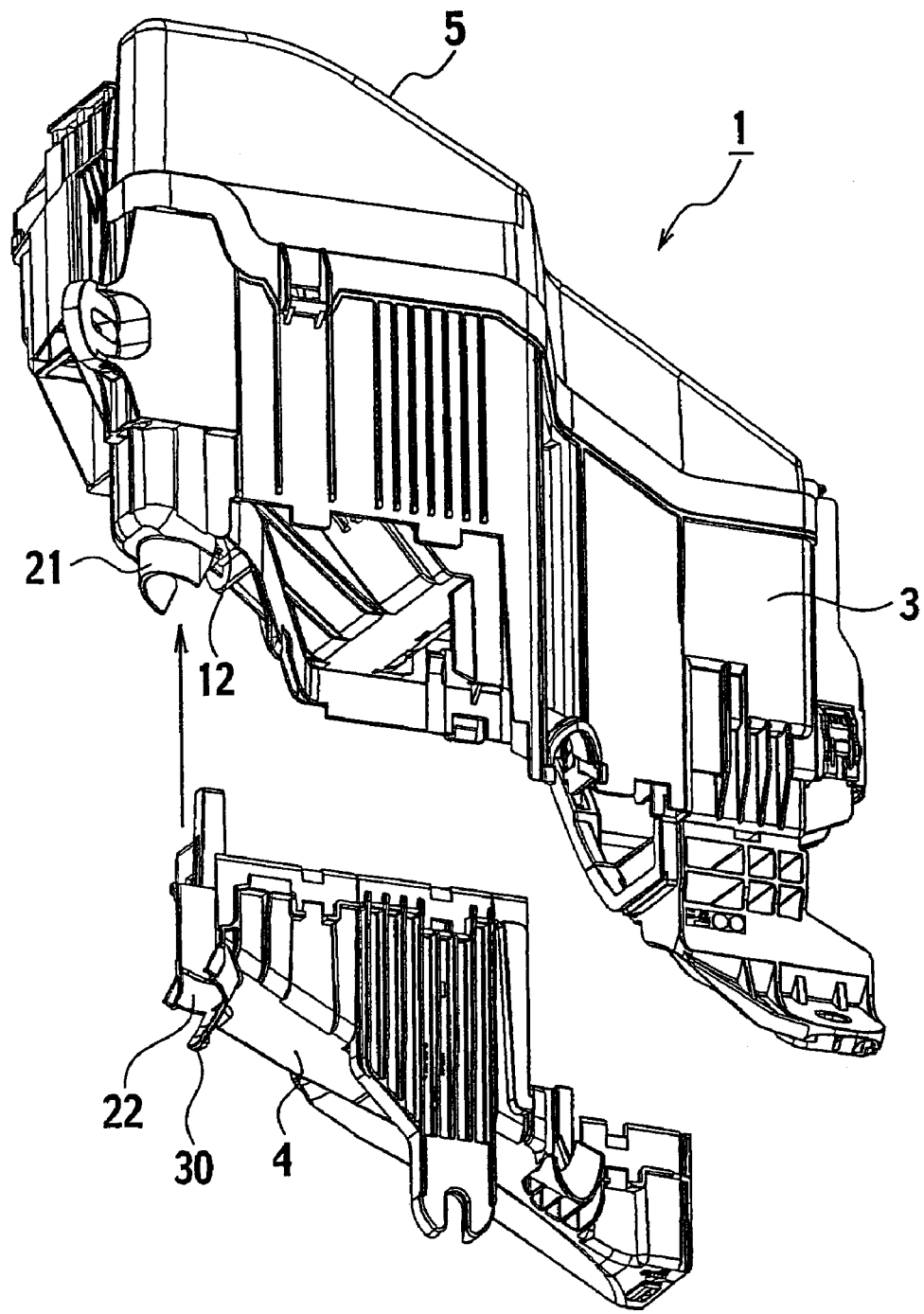
FIG. 4 is an exploded perspective view of the electric box according to the embodiment of the present invention.
Figure 5:
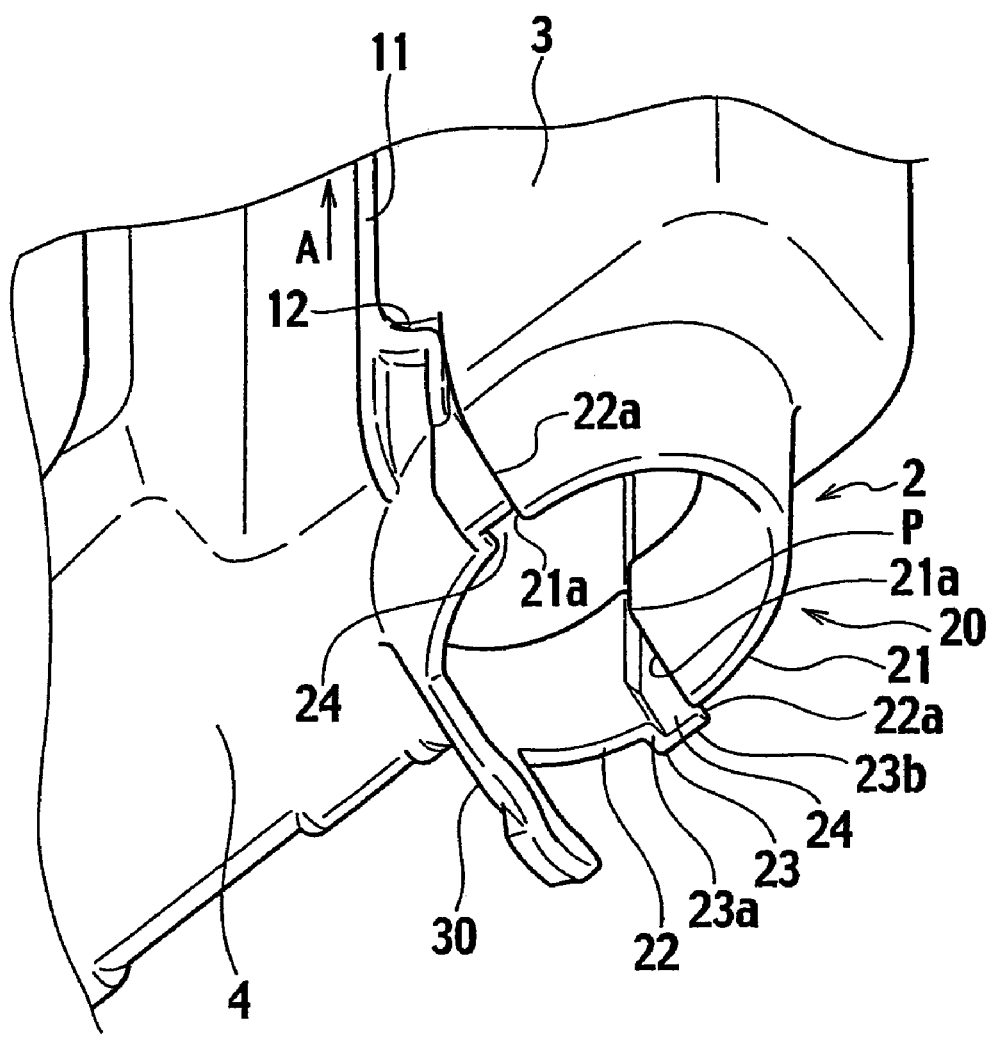
FIG. 5 is an enlarged perspective view from below of a wire harness leading-out opening of the electric box according to the embodiment of the present invention.
Figure 6:
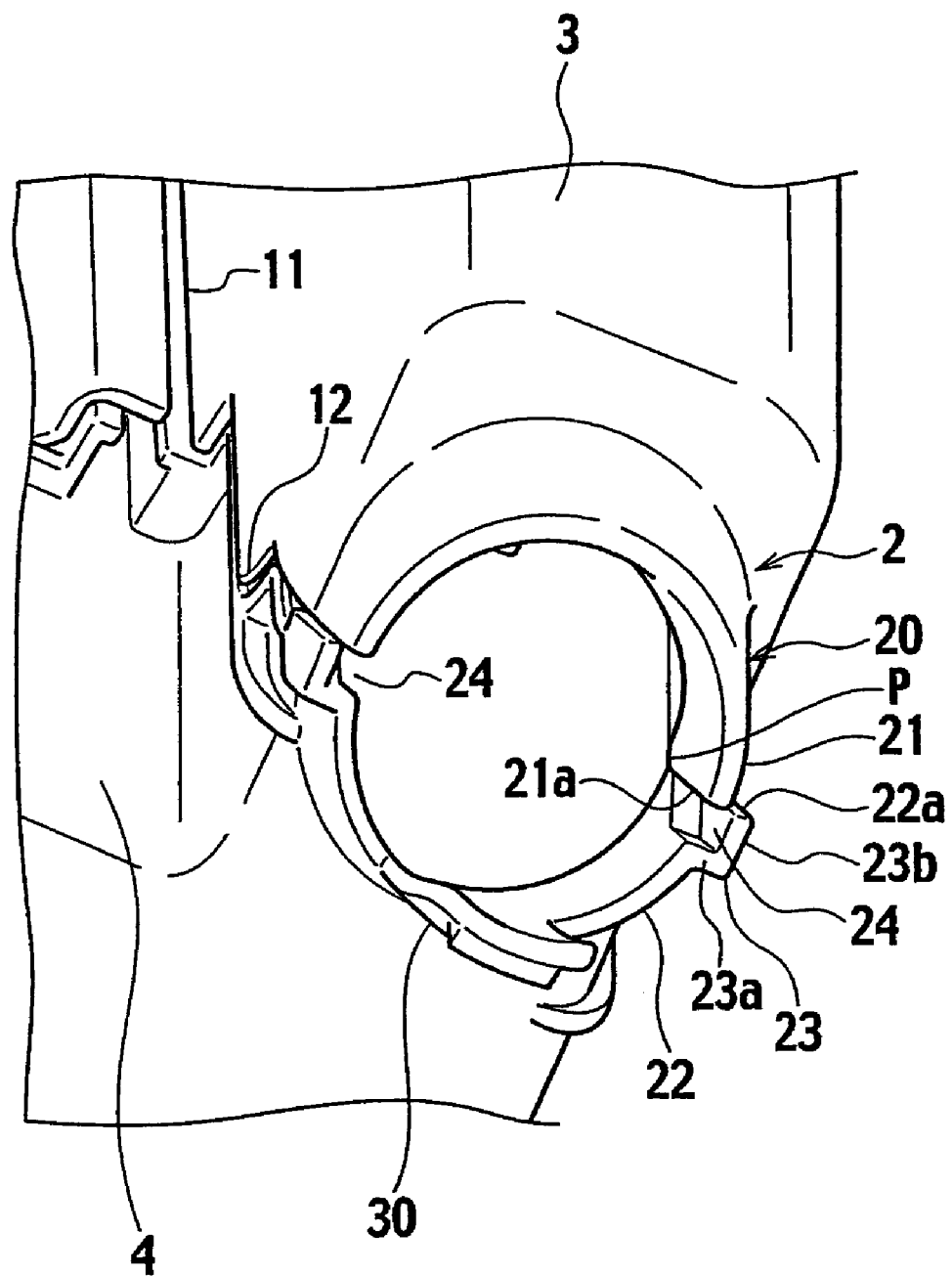
FIG. 6 is an enlarged perspective view taken from FIG. 5 from a slightly different angle.
Figure 7:
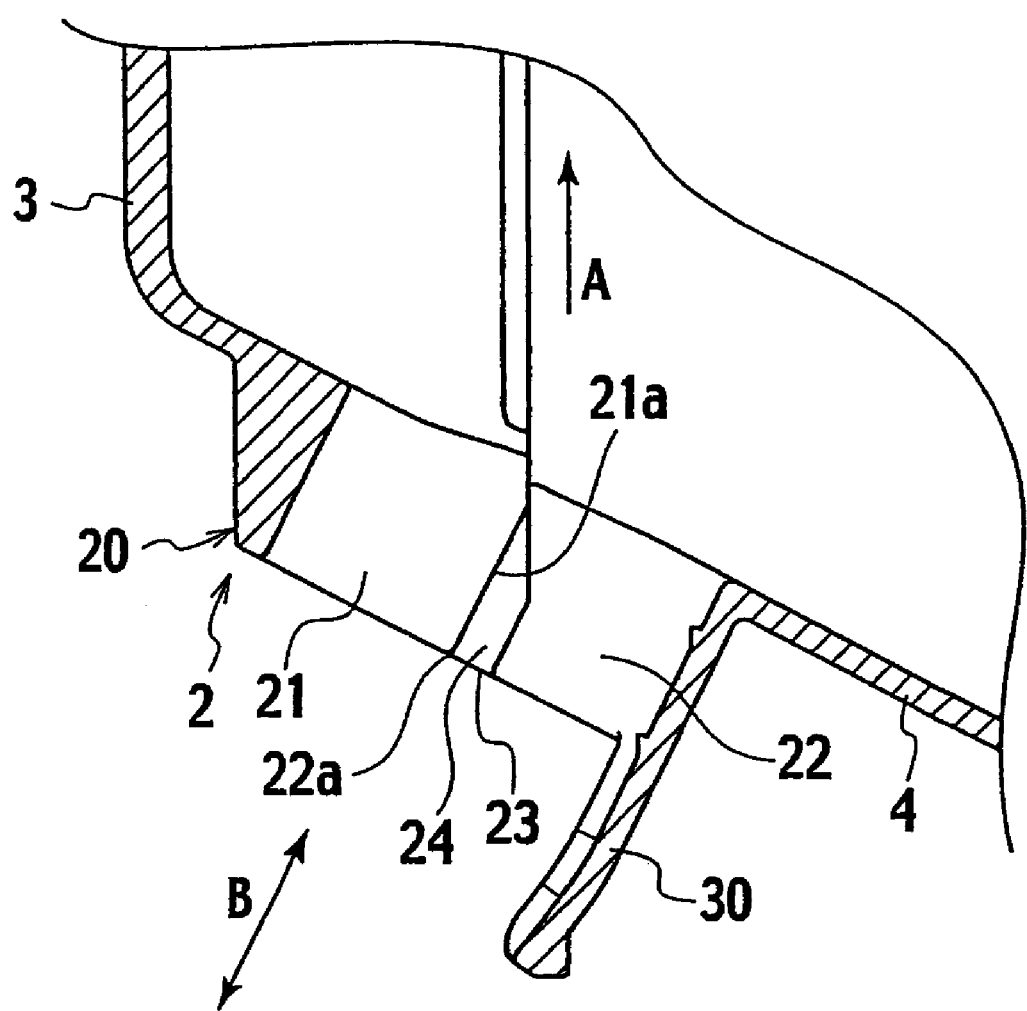
FIG. 7 is a longitudinal cross-sectional view of the wire harness leading-out opening according to the embodiment of the present invention.
Figure 8:
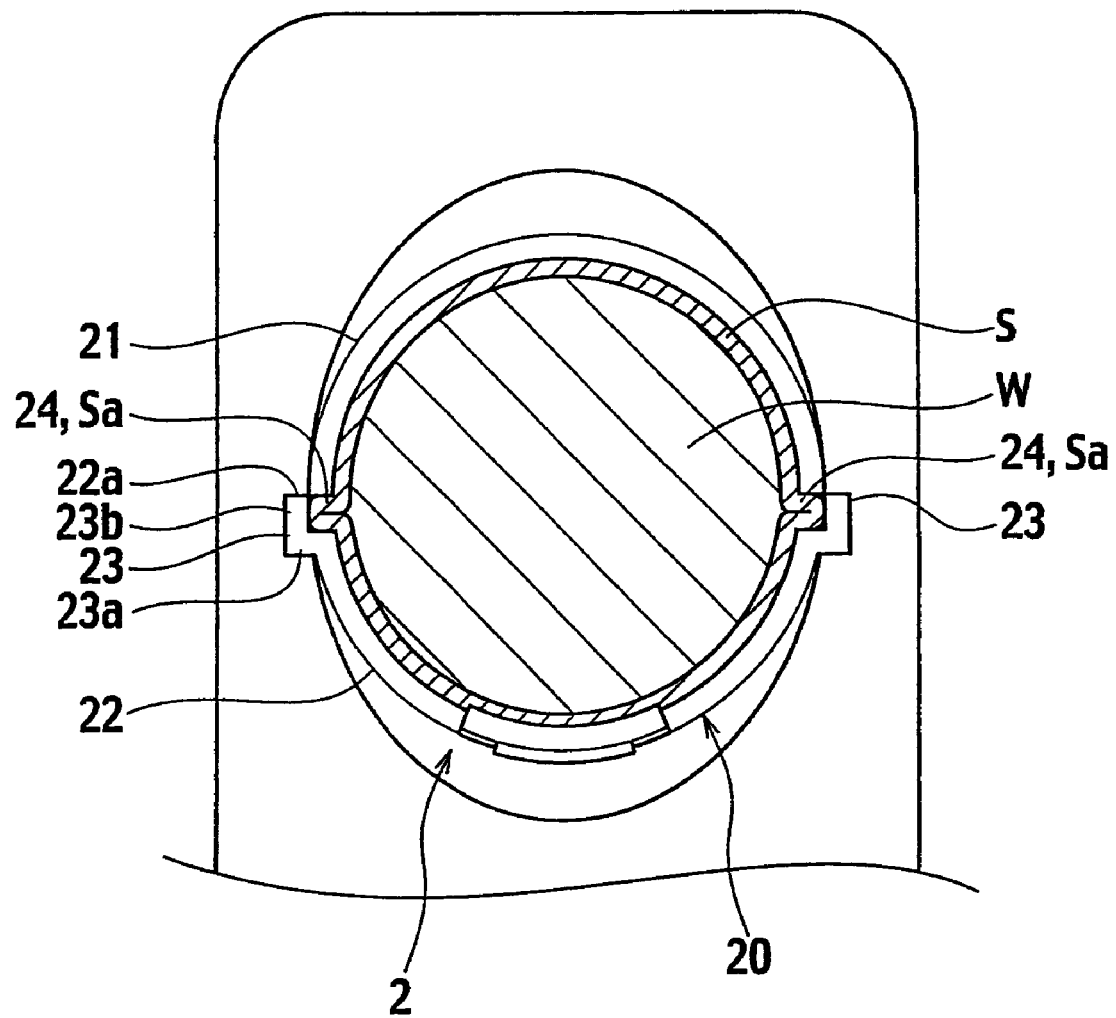
FIG. 8 is a front view of the wire harness leading-out opening according to the embodiment of the present invention when a wire harness is led out from the electric connection box. The front view is taken in an axial direction of the wire harness from the outside of the electric connection box.

FIG. 2 is an external perspective view from obliquely above of an electric connection box according to an embodiment of the present invention. FIGS. 3 and 4 are an external perspective view from obliquely below and an exploded perspective view of the electric connection box, respectively. FIG. 5 is an enlarged perspective view from below of a wire harness leading-out opening of the electric connection box. FIG. 6 is an enlarged perspective view taken from FIG. 5 from a slightly different angle. FIG. 7 is a longitudinal cross-sectional view of the wire harness leading-out opening. FIG. 8 is a front view of the wire harness leading-out opening when a wire harness is led out from the electric connection box. A cross section of the wire harness is shown in the drawing.

As shown FIGS. 2 to 4, an electric connection box 1 is provided on the bottom surface thereof with a wire harness leading-out opening 2 for leading out a wire harness W from the inside of the electric connection box to the outside thereof. The electric connection box 1 is composed of an electric connection box body 3 (first member), a bottom surface cover 4 (second member), an upper surface cover 5, and the like. The wire harness leading-out opening 2 is formed at a junction between the electric connection box body 3 and the bottom surface cover 4.

In this case, the bottom surface cover 4 is coupled to the electric connection box body 3 by being slid from below after the wire harness is tentatively arranged in a lateral opening portion of the electric connection box body 3. As shown in FIGS. 5 and 6, a slide guide portion 11 arranged in a longitudinal direction of the electric connection box and a stopper portion 12 located at the bottom end of the slide guide portion 11 are provided at a junction between the lateral walls of the electric connection box body 3 and the bottom surface cover 4. An arrow A in FIG. 5 indicates the direction of the sliding of the bottom surface cover 4 when being coupled to the electric connection box body 3. In the assembly of the bottom surface cover 4 to the electric connection box body 3 by sliding the bottom surface cover 4 in the direction of the arrow A along with the guide of the slide guide portion 11, the bottom surface cover 4 stops at the position of the stopper portion 12, and then the electric connection box 3 and the bottom surface cover 4 are locked together by a lock mechanism which is not shown in the drawing.

The wire harness leading-out opening 2 is provided on the periphery thereof with a cylindrical wire harness leading-out guide 20. The cylindrical wire harness leading-out guide 20 is formed by putting together circumferential ends 21a of a half-cylindrical body 21 (first half-cylindrical body) provided on the electric connection box body 3 and circumferential ends 22a of a half-cylindrical body 22 (second half-cylindrical body) provided on the bottom surface cover 4. An axial direction B of the cylindrical wire harness leading-out guide 20 is configured to be slightly oblique with respect to the sliding direction (vertical direction) of the bottom surface cover 4 being coupled to the electric connection box body 3, as shown in FIG. 7.

The present embodiment is characterized in that the cylindrical wire harness leading-out guide 20 includes in the inner circumference thereof concave portions 24 each located at the junctions between the half-cylindrical body 21 provided on the electric connection box body 3 and the half-cylindrical body 22 provided on the bottom surface cover 4. The concave portions 24 are formed so as to accommodate a loose portion Sa of an armoring member S wrapped around the outer circumference of the wire harness W, as shown in FIG. 8.

Each of the concave portions 24 is formed in a groove shape along a longitudinal direction of the wire harness, as shown in FIG. 5. Each of the groove-shaped concave portion is formed so as to have the groove width gradually narrowing as approaching from the outside of the electric connection box 1 to the inside thereof. Accordingly, in the view from around the center of the wire harness leading-out guide 20, each of the concave portions 24 appears as a substantially trapezoidal shape narrowing towards the back side of the view. Each of the concave portions 24 is formed by providing a curved wall 23 that has an L-shaped cross section bending outwardly, at both circumferential ends of the peripheral wall of the half-cylindrical body 22 of the bottom surface cover 4.

Each of the curved walls 23 that has an L-shaped cross section is composed of a transverse wall 23a projecting outwardly and perpendicularly from the peripheral wall of the half-cylindrical body 22; and a longitudinal wall 23b bending from the end of the transverse wall 23a towards the circumferential end of the counterpart half-cylindrical body 21. The transverse wall 23a is configured to have a gradual slope towards the circumferential end of the counterpart half-cylindrical body 21 as it approaches from the outside of the electric connection box 1 to the inside thereof so that the groove width of the groove-shaped concave portion 24 gradually narrows. Then, when the end of an inner peripheral portion of the longitudinal wall 23b comes in contact with the outer peripheral portion of the counterpart half-cylindrical body 21 at the circumferential end thereof, the cylindrical wire harness leading-out guide 20 is formed so as to have no circumferential gap. Furthermore, the two half-cylindrical bodies 21 and 22 are closely attached to each other at a back end P (see FIG. 5) of each of the concave portions 24.

At the edge of the half-cylindrical body 22 formed on the bottom surface cover 4, a tape fixing portion 30 is formed for attaching the wire harness W by a piece of tape.

Having such a configuration described above, as shown in FIG. 8, it is possible to accommodate the loose portions Sa of the armoring member S (for example, a protection plastic sheet and tape) wrapped around the outer circumference of the wire harness W into the concave portions 24 formed on the inner circumference of the cylindrical wire harness leading-out guide 20. Accordingly, there would be no risk of catching the loose portions Sa of the armoring member S at the junctions of the half-cylindrical bodies 21 and 22 when they are coupled to each other to form the cylindrical wire harness leading-out guide 20.

According to such a configuration, the electric connection box body 3 and the bottom surface cover 4 can be easily coupled to each other. The two half-cylindrical bodies 21 and 22 can also be coupled to each other without having any unnecessary gap formed therebetween, and therefore there would be no risk of damaging the armoring member S. As a result, it is possible to prevent water to get in from the wire harness leading-out port of the electric connection box 1 more securely, and, at the same time, the wire harness W can be fixed more securely.

Furthermore, the concave portions 24 for accommodating loose portions Sa of the armoring member S of the wire harness W are formed in a groove shape along a longitudinal direction of the wire harness, and the groove-shaped concave portions 24 are each formed so as to have the groove width gradually narrowing as approaching from the outside of the electric connection box to the inside thereof. Therefore, looseness of the armoring member S can be tightened more strongly towards the inside of the electric connection box 1; thus, the waterproofing and the fixation of the wire harness W can be further improved.

Futhermore, each of the concave portions 24 for accommodating a loose portion Sa of the armoring member S of the wire harness W is provided by forming a curved wall 23 that has an L-shaped cross section at both circumferential ends of the half-cylindrical body 22 on the bottom surface cover 4. Accordingly, the concave portions 24 can be formed without unnecessarily increasing the thickness of the half-cylindrical body 22; thus, it is possible to avoid deteriorating the formability in the resin molding process of the electric connection box.

Furthermore, the concave portion 24 is provided at both ends of the half-cylindrical body 22 formed on the bottom surface cover 4. In the assembly, the wire harness W is firstly placed on the half-cylindrical body 22 formed on the bottom surface cover 4, the loose portion Sa of the armoring member S is accommodated into the concave portion 24 located on the bottom surface cover 4, and then the bottom surface cover 4 is coupled to the electric connection box body 3. By taking this procedure, the bottom surface cover 4 and the electric connection box body 3 can be coupled to each other smoothly without catching, at the junction therebetween, the loose portion Sa of the armoring member S. After the assembly, the wire harness W can be led out from the cylindrical wire harness leading-out guide 20 composed of two half-cylindrical bodies 21 and 22.

Furthermore, the axial direction of the cylindrical wire harness leading out guide 20 is obliquely arranged with respect to the direction in which the cover 4 is slid into the electric connection body 3 when the cover 4 is coupled to the electric connection box body 3. Accordingly, along with the sliding movement to couple the bottom surface cover 4 to the electric connection box body 3, the half-cylindrical body 22 formed on the bottom surface cover 4 can be coupled to the half-cylindrical body 21 formed on the electric connection box body 3 from an angle in a slightly sliding manner. Hence, a loose portion of the armoring member S of the wire harness W is less likely to be caught at the junctions between the two half-cylindrical bodies, and therefore the efficiency of the assembly operation can be improved. As described above, it is possible to securely and easily couple the bottom surface cover 4 to the electric connection box body 3.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A wire harness leading-out port structure of an electric connection box, comprising:
   a first member and a second member to be coupled to each other,
   the coupled first member and second member having a wire harness leading-out opening formed at a junction between the first member and the second member, the wire harness leading-out opening being used for leading out a wire harness from an inside to an outside of the coupled first member and second member,
   the first member including a first half-cylindrical body around a periphery of the wire harness leading-out opening of the first member,
   the second member including a second half-cylindrical body around a periphery of the wire harness leading-out opening of the second member, wherein
   the first half-cylindrical body and the second half-cylindrical body are coupled to each other at both circumferential ends of the first and second half-cylindrical bodies so as to form a cylindrical wire harness leading-out guide for guiding the wire harness, and a concave portion for accommodating a loose portion of an armoring member wrapped around an outer circumference of the wire harness is formed in an inner circumference of a circumferential junction between peripheral walls of the first and second cylindrical bodies.

2. The wire harness leading-out port structure of an electric connection box according to claim 1, wherein the concave portion is formed in a groove shape in a longitudinal direction of the wire harness, and is formed so as to have a width of the groove gradually narrowing as approaching from the outside to the inside of the coupled first member and second member.

3. The wire harness leading-out port structure of an electric connection box according to claim 1, wherein curved walls each having an L-shaped cross section bending outwardly for forming the concave portion are respectively provided on both circumferential ends of a peripheral wall of any one of the first and second half-cylindrical bodies.

4. The wire harness leading-out port structure of an electric connection box according to claim 1, wherein
the first member is an electric connection box body,
the second member is a cover to be coupled subsequently to the electric connection box body in a sliding motion, and
the concave portion is formed on both circumferential ends of a peripheral wall of the second half-cylindrical body formed on the cover.

5. The wire harness leading-out port structure of an electric connection box according to claim 4, wherein an axial direction of the wire harness leading-out guide is arranged obliquely with respect to the direction in which the cover is slid into the electric connection body when the cover is coupled to the electric connection body.

* * * * *